United States Patent [19]

Heim et al.

[11] Patent Number: 5,597,758
[45] Date of Patent: Jan. 28, 1997

[54] METHOD FOR FORMING AN ELECTROSTATIC DISCHARGE PROTECTION DEVICE

[75] Inventors: Barry B. Heim, Mesa; Freeman D. Colbert, Gilbert, both of Ariz.

[73] Assignee: Motorola, Inc., Schaumburg, Ill.

[21] Appl. No.: 283,437

[22] Filed: Aug. 1, 1994

[51] Int. Cl.⁶ .................. H01L 21/265; H01L 21/70; H01L 27/00
[52] U.S. Cl. .................. 437/60; 437/50; 437/904
[58] Field of Search .................. 437/29, 50, 931, 437/904, 60; 257/355, 356, 357, 358, 359, 360, 361, 362, 363

[56] References Cited

U.S. PATENT DOCUMENTS

| | | | |
|---|---|---|---|
| 3,396,317 | 8/1968 | Vendelin | 437/904 |
| 4,175,317 | 11/1979 | Aoki et al. | 29/571 |
| 4,322,882 | 4/1982 | Vora | 29/571 |
| 4,596,605 | 6/1986 | Nishizawa et al. | 148/1.5 |
| 4,736,271 | 4/1988 | Mack et al. | 257/363 |
| 5,027,181 | 6/1991 | Larik et al. | 257/355 |
| 5,060,037 | 10/1991 | Rountree . | |
| 5,081,514 | 1/1992 | Ueoka | 257/355 |
| 5,100,812 | 3/1992 | Yamada et al. | 437/31 |
| 5,138,413 | 8/1992 | Grosset et al. . | |

Primary Examiner—John Niebling
Assistant Examiner—Brian K. Dutton
Attorney, Agent, or Firm—Rennie William Dover

[57] ABSTRACT

An ESD protection device and a method for forming the ESD protection device in an active region (13) which is devoid of a field oxide (14). A P type dopant region (22) and an N type dopant region (27) are formed in a semiconductor substrate (11) using photolithographic techniques, wherein they are spaced apart from each other by a spacer region (29). An anode electrode (33) contacts the P type dopant region (22) and a cathode electrode (34) contacts the N type dopant region (27). A parasitic diode resistance of the ESD protection device is governed by the width of the spacer region (29) which, in turn, is governed by the resolution of the photolithographic techniques. Thus, the present invention provides a method for lowering both the parasitic diode resistance and clamp voltage of the ESD protection device which serves to protect integrated circuits from large voltage transients.

17 Claims, 4 Drawing Sheets

METHOD FOR FORMING AN ELECTROSTATIC DISCHARGE PROTECTION DEVICE

BACKGROUND OF THE INVENTION

The present invention relates, in general, to electrical protection devices, and more particularly, to integrated devices which protect monolithic integrated circuits from damage by large voltage transients.

It is well known that monolithic integrated circuits may become damaged by exposing their input or output terminals to large and sudden voltage transients such as electrostatic discharges. For example, electrostatic charge may build up on personnel and test equipment. When the charged person or piece of test equipment contacts the input or output terminals of the integrated circuit, the built-up electrostatic charge discharges and may force large currents into the integrated devices. The large currents may rupture dielectric materials within the integrated devices such as gate oxides or they may melt conductive materials such as polysilicon or aluminum interconnects, thereby irreparably damaging the integrated circuits.

Generally, integrated circuit manufacturers include protection devices that shunt current away from input and output circuitry within the integrated devices, thereby preventing damage to the integrated devices by large voltage transients. One technique for protecting integrated device input and output circuitry is to form current shunting structures from parasitic elements present in the integrated devices. A disadvantage of this technique is that the breakdown voltages of these structures is limited by the processing techniques of the particular integrated circuit. Another technique for protecting these circuits is to improve the energy dissipation capability of the protection circuitry. This is done by laying out the protection circuit to have larger geometries, wider metal interconnects, more and larger contacts, increased spacing, etc. A disadvantage of this approach is it increases the size of the integrated device and thus decreases the number of integrated circuits per semiconductor wafer, thereby increasing the cost of manufacturing the integrated circuits. In yet another technique, silicon controlled rectifiers (SCR) serve to shunt current away from the input and output circuitry. A disadvantage of this technique is that SCR's are sensitive to layout and process variation, possibly resulting in latchup and leakage during normal operation.

Accordingly, it would be advantageous to have an integrated device for protecting an integrated circuit from large voltage transients and a method for manufacturing the integrated device. It would be of further advantage for the integrated device to occupy a small area and be capable of protecting integrated circuit input and output structures.

DETAILED DESCRIPTION OF THE DRAWINGS

Generally, the present invention provides an electrostatic discharge (ESD) protection device and a method for fabricating the device. In accordance with the present invention, the electrostatic discharge protection device is fabricated in a region of a semiconductor substrate that is free of a field oxide. This region is referred to as an active region for the electrostatic discharge protection device. In one embodiment, the electrostatic discharge protection device is a diode comprising an N-region spaced apart from a P-region. The N and P regions are fabricated by coating the semiconductor substrate with a layer of photoresist, forming openings in the layer of photoresist to expose portions of the semiconductor substrate, and implanting or diffusing an impurity material of N conductivity type into one of the exposed portions of the semiconductor substrate to form the N-region, and implanting or diffusing an impurity material of P conductivity type into another of the exposed portions of the semiconductor substrate to form the P-region. Then, electrodes are formed to contact the N-region and the P-region.

Figure 1:
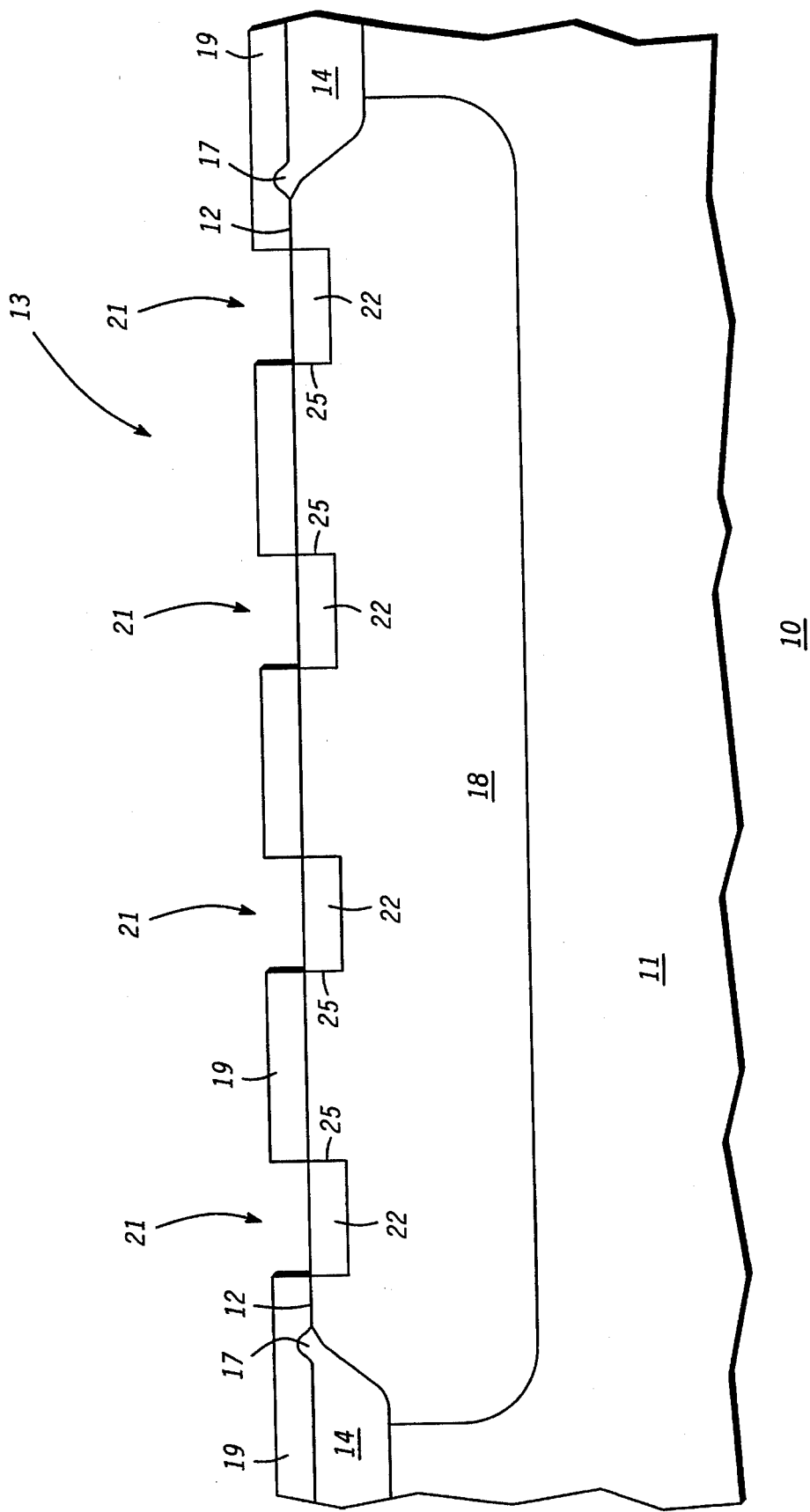
FIGS. 1–3 illustrate highly enlarged cross-sectional views of a portion of an electrostatic discharge protection device during processing in accordance with an embodiment of the present invention.

FIG. 1 illustrates a highly enlarged cross-sectional view of a portion 10 of an ESD protection device during processing in accordance with an embodiment of the present invention. What is shown in FIG. 1 is a semiconductor substrate 11 of N conductivity type having a major surface 12 and an active region 13 surrounded by a field oxide 14. It should be noted that the portions of field oxide 14 adjacent major surface 12 are shown as having bulges or bumps 17. As those skilled in the art are aware, bulges 17 result from an oxidation step during the formation of field oxide 14 and are commonly referred to as bird's heads. Techniques for forming field oxide 14 and the resulting bird's heads 17 are well known to those skilled in the art.

In addition, active region 13 includes a dopant region or dopant well 18 of P conductivity type extending vertically from major surface 12 into semiconductor substrate 11 and extending laterally under portions of field oxide 14. Dopant region 18, also referred to as a well or tub, may be formed by implanting a dopant or impurity material of P conductivity type such as, for example, boron into active region 13. Alternatively, dopant region 18 may be formed by diffusing the P type impurity material into active region 13. By way of example, dopant region 18 has a junction depth ranging between approximately 3 microns (μm) and approximately 5 μm and a surface concentration of P type impurity material ranging between approximately $1 \times 10^{16}$ atoms per cubic centimeter (atoms/cm$^3$) and approximately $1 \times 10^{19}$ atoms/cm$^3$. Techniques for forming dopant region 18 are well known to those skilled in the art. It should be understood that the conductivity type of semiconductor substrate 11 and dopant region 18 is not a limitation of the present invention. In other words, semiconductor substrate 11 may be of P conductivity type and dopant region 18 may be of N conductivity type. It should be further understood that the formation of dopant region 18 is optional.

Major surface 12 and field oxide 14 are coated with a layer of photoresist 19. Then, openings 21 are formed in layer of photoresist 19 to expose portions of major surface 12. Techniques for coating major surface 12 and field oxide 14 with layer of photoresist 19 and forming openings 21 in layer of photoresist 19 are well known to those skilled in the art.

An impurity material of P conductivity type is implanted through openings 21 into semiconductor substrate 11 to form dopant regions 22 having sidewalls 25. More particularly, the impurity material is implanted into dopant region 18. By way of example, dopant regions 22 have a junction depth ranging between approximately 0.2 μm and approximately 0.4 μm and a surface concentration ranging between approximately $1.0 \times 10^{15}$ atoms/cm$^3$ and approximately $1.0 \times 10^{16}$ atoms/cm$^3$. Although not shown, layer of photoresist 19 is removed from major surface 12 and field oxide 14 using techniques well known to those skilled in the art.

Figure 2:
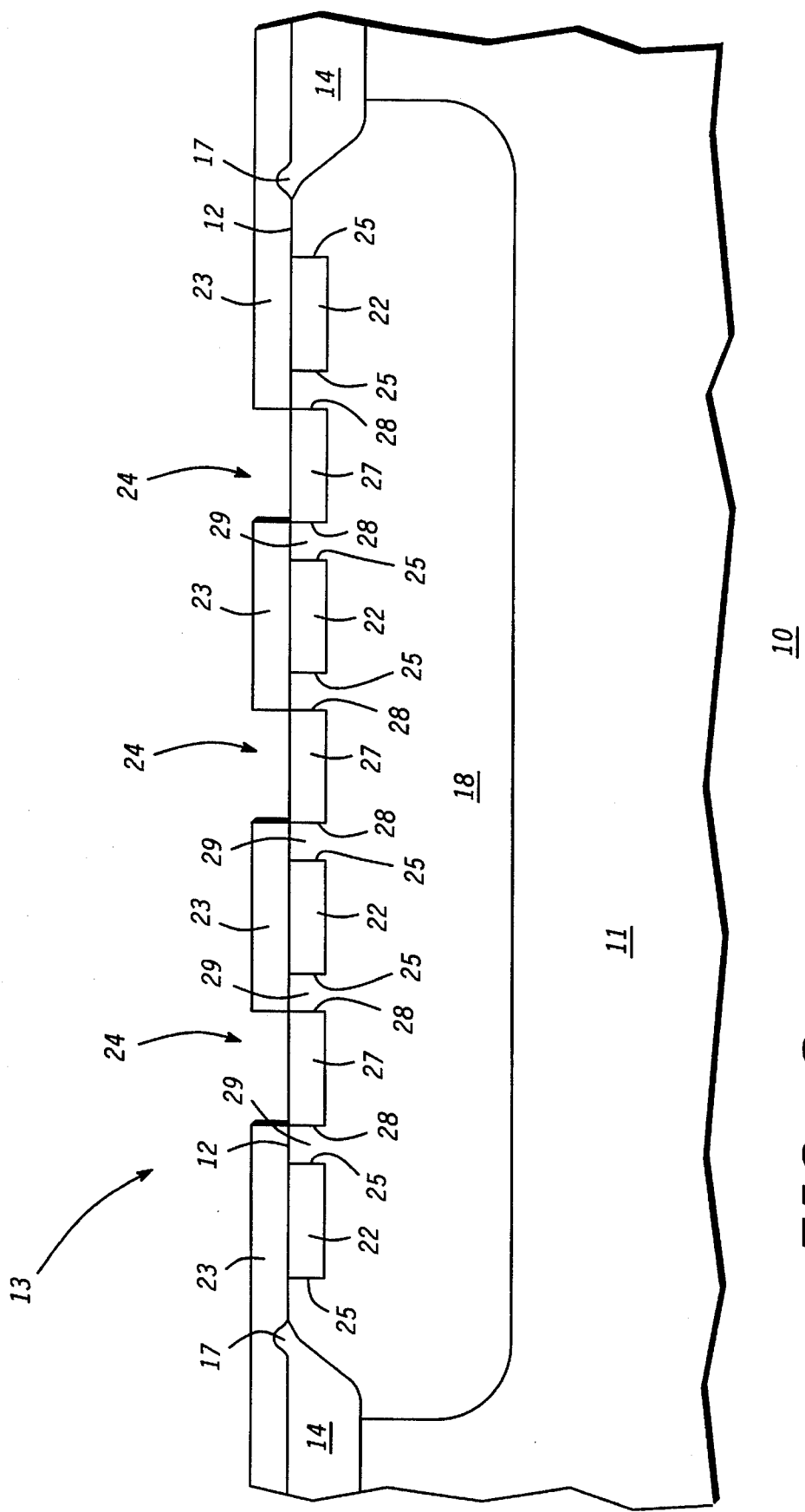

Now referring to FIG. 2, major surface 12 and field oxide 14 are coated with a layer of photoresist 23. It should be understood that the same reference numerals are used in the figures to denote the same elements. Then, openings 24 are formed in layer of photoresist 23 to expose portions of major surface 12. An impurity material of N conductivity type is implanted through openings 24 into semiconductor substrate 11 to form dopant regions 27 having sidewalls 28, wherein sidewalls 28 form metallurgical junctions with dopant region 18. By way of example, dopant regions 27 have a junction depth ranging between approximately 0.1 μm and approximately 0.25 μm and a surface concentration ranging between approximately $1 \times 10^{16}$ atoms/cm$^3$ and adjacent sidewalls 25 and 28 of the first dopant region and the second dopant region, respectively, is at least 1 micron. It should be noted that each dopant region 27 is between two adjacent dopant regions 22 and that at least one of the dopant regions 27 is adjacent to one of the two adjacent dopant regions 22. Moreover, it should be noted that regions 27 and regions 22 can be interchanged. This would allow that each dopant region 22 would be between two adjacent dopant regions 27 and that at least one of the dopant regions 22 would be adjacent to one of the two adjacent dopant regions 27. In other words, dopant regions 27 are interdigitated with and spaced apart from dopant regions 22. Using techniques well known to those skilled in the art, layer of photoresist 23 is removed. It should be understood that the method for forming dopant regions 22 and 27 is not a limitation of the present invention. For example, dopant regions 22 and 27 may be formed using diffusion techniques. It should be understood that the shape, junction depths and surface concentrations provided for the examples of regions 22 and 27 are not limitations of the present invention.

In the embodiment shown in FIG. 2, interdigitated dopant regions 22 and 27 form a plurality of parallel diode structures, wherein the spacer regions 29 between adjacent sidewalls 25 and 28 set the series resistance of each diode structure. It should be understood by those skilled in the art that the series resistance of each diode may be decreased by decreasing the distance between sidewalls 25 and 28 of adjacent dopant regions 22 and 27, respectively, and increased by increasing the distance between these sidewalls 25 and 28. In accordance with the present invention, field oxide is not formed in active region 13 and in particular in spacer regions 29, i.e., between sidewalls 25 and 28 of adjacent dopant regions 22 and 27, respectively. It should be further understood that sidewalls 25 and 28 serve as active diode regions, thereby increasing the active diode area for a specified chip area.

Figure 3:
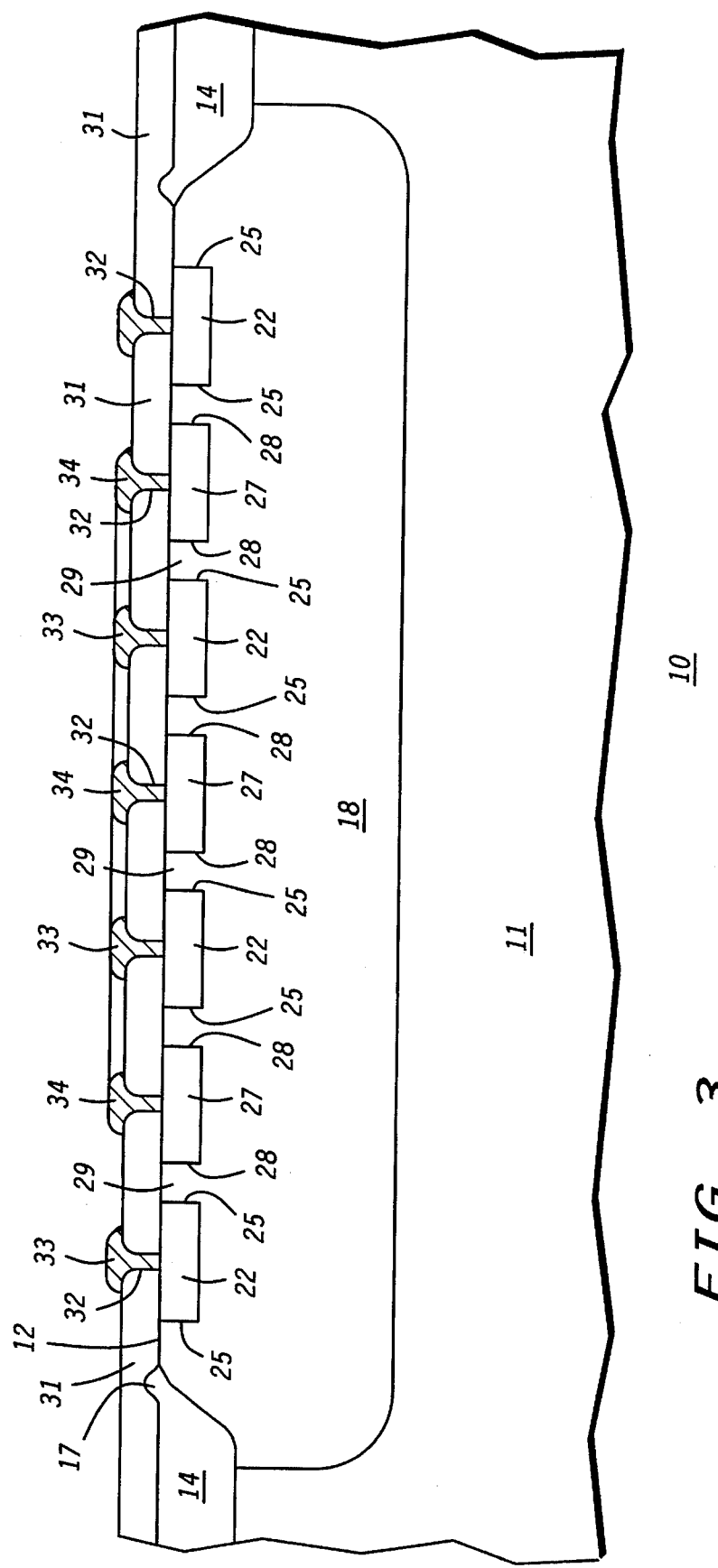

Now referring to FIG. 3, major surface 12 and field oxide 14 are coated with a conformal layer of dielectric material 31. Suitable materials for layer of dielectric material 31 include silicon dioxide, nitride, and the like. By way of example, layer of dielectric material 31 has a thickness ranging between approximately 5,000 angstroms and approximately 7,000 angstroms. Using techniques well known to those skilled in the art, openings 32 are formed in layer of dielectric material 31 to expose a portion of surface 12 of dopant regions 22 and 27. Anode electrodes 33 are formed by filling openings 32, which expose surface 12 of dopant regions 22, with a conductive material. Cathode electrodes 34 are formed by filling openings 32, exposing surface 12 of dopant regions 27, with a conductive material. In other words, anode electrodes 33 contact dopant regions 22 and cathode electrodes 34 contact dopant regions 27.

Suitable materials for electrodes 33 and 34 include aluminum, titanium, tungsten, molybdenum, tantalum, and combinations thereof. Techniques for forming electrodes in contact with dopant regions are known to those skilled in the art.

Figure 4:
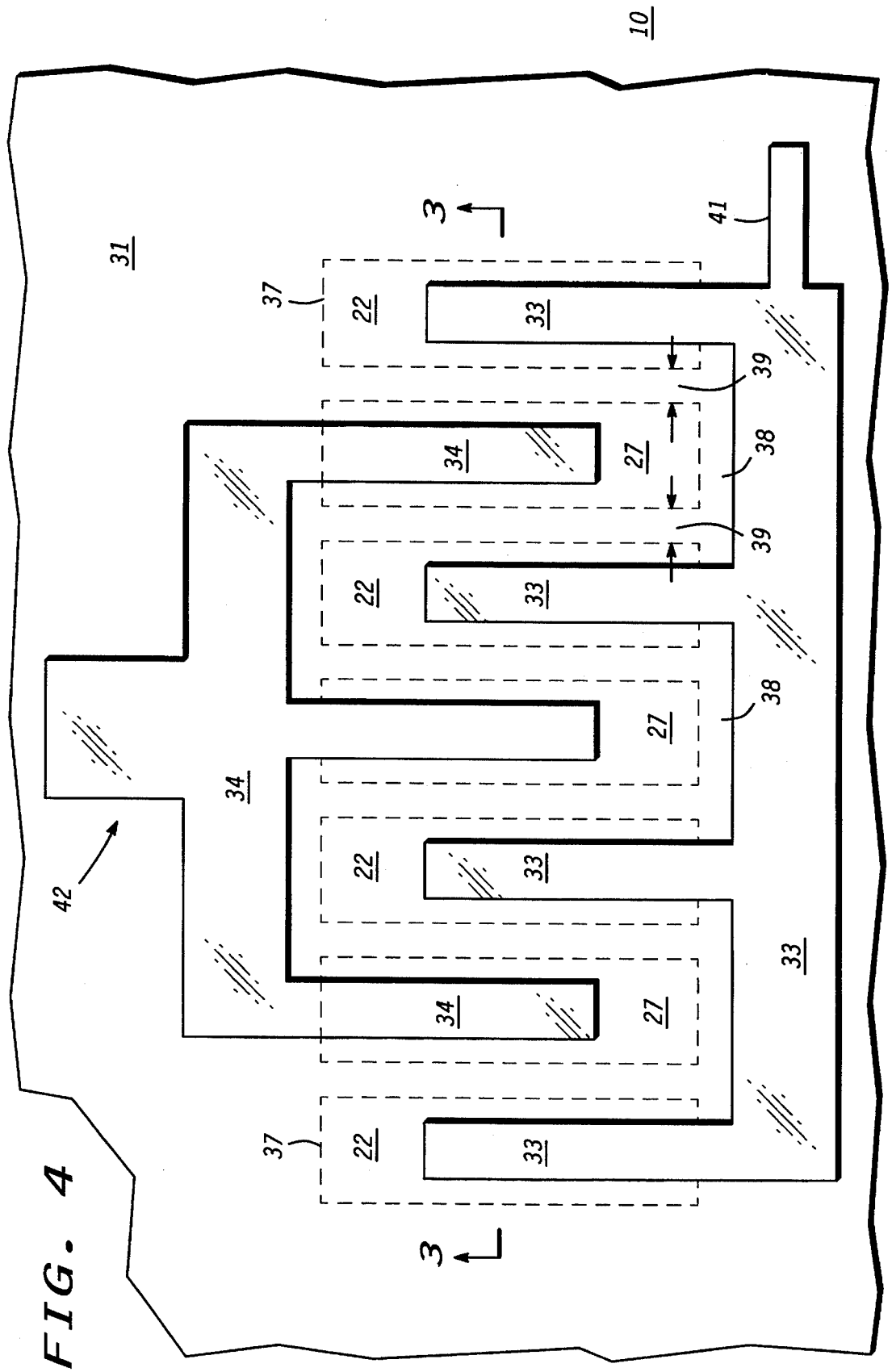
FIG. 4 illustrates a top view of the electrostatic discharge protection device of FIG. 3.

Now referring to FIG. 4, a top view of the portion 10 of the ESD protection device of FIG. 3 is illustrated. The location of dopant regions 22 and 27 below layer of dielectric material 31 are illustrated by broken lines 37 and 38, respectively. In addition, the spacer regions 29 are indicated by arrows 39. Anode electrodes 33 are shown as a plurality of conductive fingers over dopant regions 22 and portions of layer of dielectric material 31. Preferably, anode electrodes 33 are coupled to a ground potential via extension 41. Cathode electrodes 34 are shown as a plurality of conductive fingers over dopant regions 27 and portions of layer of dielectric material 31. Preferably, portions of cathode electrodes 34 are interdigitated with portions of anode electrodes 33 and a portion of cathode 34 is coupled to contact pad 42.

By now it should be appreciated that an ESD protection device and a method for fabricating the ESD protection device have been provided. Electrostatic discharge protection devices manufactured in accordance with the present invention may have dopant regions in an area less than 2,000 square microns, wherein a machine model ESD voltage of the electrostatic discharge protection device is at least 500 volts. Preferably, the ESD protection device of the present invention is fabricated in an active region that is devoid of field oxide. In one embodiment, the ESD protection device is a diode comprising two dopant regions that are spaced apart from each other, wherein the spacer region between the two dopant regions is devoid of field oxide. The absence of field oxide in the spacer region lowers the parasitic diode resistance between the two dopant regions and permits the depletion regions formed at the junctions of regions 27 and 18 to spread freely under reverse bias conditions. If the depletion zone spreads all the way across the spacer regions, the diode will exhibit a reduced breakdown voltage. The reduced parasitic resistance and the reduced breakdown voltage both result in reduced energy passed into the integrated circuit being protected. Since the locations of the dopant regions are photolithographically defined, the width of the spacer regions, i.e., the distance between the two dopant regions, is limited by the resolution of the photolithographic technique rather than by the width of the field oxide between said dopant regions. Further, the active area of the protection device includes the sidewalls of the dopant regions, resulting in a larger active area of the protection device. In addition, the junction that breaks down for the protection device of the present invention is the junction between dopant regions 18 and 27.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, a single diode may be fabricated in accordance with the present invention. Moreover, the connectivity of the anode and cathode regions of the invention can vary, for example, interdigitated anode electrodes 33 can connect to a voltage potential other than ground.

We claim:

1. A method for fabricating an electrostatic discharge protection device, comprising the steps of:

providing a semiconductor substrate of a first conductivity type, the semiconductor substrate having a surface;

forming a first layer of photoresist on the surface;

forming an opening in the first layer of photoresist;

implanting an impurity material of the first conductivity type through the opening in the first layer of photoresist into a first portion of the semiconductor substrate to form a dopant region of the first conductivity type;

removing the first layer of photoresist;

forming a second layer of photoresist on the surface;

forming an opening in the second layer of photoresist;

implanting an impurity material of the second conductivity type through the opening in the second layer of photoresist into a second portion of the semiconductor substrate to form a dopant region of the second conductivity type;

removing the second layer of photoresist; and forming first and second electrodes, the first electrode in contact with the dopant region of the first conductivity type and the second electrode in contact with the dopant region of the second conductivity type.

2. The method of claim 1, further including spacing the dopant region of the second conductivity type apart from the dopant region of the first conductivity type, wherein a spacer region between the dopant region of the first conductivity type and the dopant region of the second conductivity type is devoid of field oxide.

3. The method of claim 1, further including forming a plurality of dopant regions of the first conductivity type and a plurality of dopant regions of the second conductivity type, wherein one dopant region of the first conductivity type is between two dopant regions of the second conductivity type and another of the plurality of dopant regions of the first conductivity type is adjacent to one of the two dopant regions of the second conductivity type.

4. The method of claim 3, wherein the steps of forming first and second electrodes includes electrically coupling the plurality of dopant regions of the first conductivity type to each other and electrically coupling the plurality of dopant regions of the second conductivity type to each other.

5. The method of claim 1, further including forming a plurality of dopant regions of the first conductivity type interdigitated with a plurality of dopant regions of the second conductivity type.

6. A method for fabricating an electrostatic discharge protection device, comprising the steps of:

providing a semiconductor substrate of a first conductivity type, the semiconductor substrate having a surface;

forming a first layer of photoresist on the surface;

forming an opening in the first layer of photoresist;

diffusing an impurity material of the first conductivity type through the opening in the first layer of photoresist into a first portion of the semiconductor substrate to form a dopant region of the first conductivity type;

forming a second layer of photoresist on the first layer of photoresist, the second layer of photoresist filling the opening in the first layer of photoresist;

forming an opening in the second layer of photoresist;

diffusing an impurity material of the second conductivity type through the opening in the second layer of photoresist into a second portion of the semiconductor substrate to form a dopant region of the second conductivity type;

removing the first and second layers of photoresist; and forming first and second electrodes, the first electrode in contact with the dopant region of the first conductivity type and the second electrode in contact with the dopant region of the second conductivity type.

7. The method of claim 6, further including forming a plurality of dopant regions of the first conductivity type interdigitated with a plurality of dopant regions of the second conductivity type.

8. A method for fabricating a two-terminal electrostatic discharge protection device, comprising the steps of:

providing a semiconductor material of a first conductivity type and having a major surface, wherein a portion of the semiconductor material serves as an active region for the electrostatic discharge protection device;

forming a dopant region of the first conductivity type in the active region, wherein the dopant region of the first conductivity type is laterally bounded by first and second sidewalls and serves as a cathode of the electrostatic discharge protection device;

forming a dopant region of a second conductivity type in the active region, wherein the dopant region of the second conductivity type is spaced apart from the dopant region of the first conductivity type and laterally bounded by third and fourth sidewalls, and wherein a region between the dopant region of the first conductivity type and the dopant region of the second conductivity type is devoid of field oxide and serves as the anode of the electrostatic discharge protection device;

forming a cathode electrode in contact with the dopant region of the first conductivity type; and forming an anode electrode in contact with the dopant region of the second conductivity type.

9. The method of claim 8, wherein the step of forming a dopant region of the first conductivity type and the step of forming a dopant region of a second conductivity type includes forming a metallurgical junction with the semiconductor material of the first conductivity type wherein portions of the metallurgical junction serve as the third and fourth sidewalls of the dopant region of the second conductivity type.

10. The method of claim 9, wherein the step of forming a dopant region of the first conductivity type includes implanting an impurity material of the first conductivity type into a first portion of the active region and the step of forming a dopant region of a second conductivity type includes implanting an impurity material of the second conductivity type into a second portion of the active region.

11. The method of claim 9, wherein the step of forming a dopant region of the first conductivity type includes diffusing an impurity material of the first conductivity type into a first portion of the active region and the step of forming a dopant region of a second conductivity type includes diffusing an impurity material of a second conductivity type into a second portion of the active region.

12. The method of claim 9, wherein the step of forming a dopant region of the first conductivity type and the step of forming a dopant region of a second conductivity type include forming a plurality of dopant regions of the first conductivity type interdigitated with a plurality of dopant regions of the second conductivity type.

13. The method of claim 12, wherein the step of forming a cathode electrode includes forming the cathode electrode in contact with the plurality of dopant regions of the first conductivity type and the step of forming an anode electrode includes forming the anode electrode in contact with the plurality of dopant regions of the second conductivity type.

14. The method of claim 8, wherein the step of forming a dopant region of the first conductivity type includes forming the dopant region of the first conductivity type having a junction depth ranging between approximately 0.25 microns and approximately 0.4 microns and a surface concentration ranging between approximately $1.0 \times 10^{16}$ atoms/cm$^3$ and approximately $1.0 \times 10^{19}$ atoms/cm$^3$, and the step of forming a dopant region of a second conductivity type includes forming the dopant region of the second conductivity type having a junction depth ranging between approximately 0.1 microns and approximately 0.25 microns and a surface concentration ranging between approximately $1 \times 10^{16}$ atoms/cm$^3$ and approximately $6 \times 10^{20}$ atoms/cm$^3$, and wherein a distance between adjacent sidewalls of the dopant region of the first conductivity type and the dopant region of the second conductivity type is at least 1 micron.

15. The method of claim 8, wherein the step of forming a dopant region of the first conductivity type and the step of forming a dopant region of a second conductivity type include forming the dopant regions of the first and second conductivity types in an area less than 2,000 square microns, wherein a machine model ESD voltage of the electrostatic discharge protection device is at least 500 volts.

16. A method for fabricating a two-terminal electrostatic discharge protection device, comprising the steps of:

providing a semiconductor material of a first conductivity type and having a major surface, wherein a portion of the semiconductor material serves as an active region for the electrostatic discharge protection device;

forming a dopant region of the first conductivity type in the active region, wherein the dopant region of the first conductivity type is laterally bounded by first and second sidewalls and serves as a cathode of the electrostatic discharge protection device;

forming a dopant region of a second conductivity type in the active region, wherein the dopant region of the second conductivity type is spaced apart from the dopant region of the first conductivity type and laterally bounded by third and fourth sidewalls, and serves as the anode of the electrostatic discharge protection device, and wherein a dielectric material is substantially absent from a region of the semiconductor material between the dopant region of the first conductivity type and the dopant region of the second conductivity type;

forming a cathode electrode in contact with the dopant region of the first conductivity type; and forming an anode electrode in contact with the dopant region of the second conductivity type.

17. The method of claim 16, wherein the step of forming a dopant region of the first conductivity type and the step of forming a dopant region of a second conductivity type includes forming a metallurgical junction with the semiconductor material of the first conductivity type wherein portions of the metallurgical junction serve as the third and fourth sidewalls of the dopant region of the second conductivity type.

* * * * *